(12) United States Patent
Wang et al.

(10) Patent No.: US 12,254,930 B2
(45) Date of Patent: Mar. 18, 2025

(54) CONTROL METHOD FOR MEMORY ERASE OPERATIONS, APPARATUS, AND STORAGE MEDIUM THEREOF

(71) Applicant: YANGTZE MEMORY TECHNOLOGIES CO., LTD., Wuhan (CN)

(72) Inventors: Junbao Wang, Wuhan (CN); Jianquan Jia, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 211 days.

(21) Appl. No.: 18/082,491

(22) Filed: Dec. 15, 2022

(65) Prior Publication Data

US 2023/0121846 A1    Apr. 20, 2023

Related U.S. Application Data

(63) Continuation of application No. PCT/CN2021/129551, filed on Nov. 9, 2021.

(30) Foreign Application Priority Data

Jan. 6, 2021    (CN) .......................... 202110011459.1

(51) Int. Cl.
G11C 16/04    (2006.01)
G11C 16/16    (2006.01)

(52) U.S. Cl.
CPC .......... *G11C 16/16* (2013.01); *G11C 16/0483* (2013.01)

(58) Field of Classification Search
CPC ...................................................... G11C 16/16
USPC ...................................................... 365/185.29
See application file for complete search history.

(56) References Cited

U.S. PATENT DOCUMENTS 9,576,976 B1 * 2/2017 Hu .................. G11C 16/14
2012/0307557 A1   12/2012 Itagaki

FOREIGN PATENT DOCUMENTS

| CN | 110047548 A | 7/2019 |
| CN | 110277126 A | 9/2019 |
| CN | 112106200 A | 12/2020 |

(Continued)

OTHER PUBLICATIONS

First Office action issued in corresponding Chinese Application No. 202110011459, mailed on May 14, 2021, 5 pages.

(Continued)

*Primary Examiner* — Hoai V Ho
(74) *Attorney, Agent, or Firm* — BAYES PLLC

(57) ABSTRACT

The embodiments of the disclosure provide a control method and apparatus for a memory, and a storage medium. The memory has memory blocks, and each memory block has memory strings. Each of the memory strings includes a channel layer with an N-type doped top region. In a memory block, a bit line erasing voltage is applied to a select bit line, and an erasing prohibition voltage is applied to an unselect bit line. A top select gate voltage lower than the bit line erasing voltage is applied to a top select gate. When a word line erasing voltage lower than the bit line erasing voltage is applied to the corresponding word line connected to a memory string corresponding to the select bit line and the unselect bit line, the memory string corresponding to the select bit line is erased.

20 Claims, 9 Drawing Sheets

(56) References Cited

FOREIGN PATENT DOCUMENTS

CN 112614527 A 4/2021

OTHER PUBLICATIONS

International Search Report issued in corresponding International Application No. PCT/CN2021/129551, mailed on Jan. 26, 2022, 6 pages.
Written Opinion issued in corresponding International Application No. PCT/CN2021/129551, mailed on Jan. 26, 2022, 4 pages.
Notice of Allowance issued in corresponding Chinese Application No. 202110011459.1, mailed on Aug. 9, 2021, 1 pages.

* cited by examiner

| user volume | block1 | 1 | 12 | 13 | 30 | 20 | 19 |
|---|---|---|---|---|---|---|---|
| | | 31 | 2 | 27 | 4 | 28 | 18 |
| | block2 | 0 | 26 | 17 | 6 | 21 | 7 |
| | | 32 | 3 | 14 | 29 | 22 | 8 |
| | block3 | 33 | 11 | 15 | 10 | 9 | 24 |
| | | 34 | 35 | 16 | 5 | 23 | 25 |
| over provisioning | block4 | 36 | | | | | |
| | | | 37 | | | | |

| user volume | block1 | 1 | | 13 | | | 19 |
|---|---|---|---|---|---|---|---|
| | | | 2 | | 4 | | |
| | block2 | 0 | 26 | 17 | 6 | 21 | 7 |
| | | 32 | 3 | 14 | 29 | 22 | 8 |
| | block3 | 33 | 11 | 15 | 10 | 9 | 24 |
| | | 34 | 35 | 16 | 5 | 23 | 25 |
| over provisioning | block4 | 36 | 12 | 30 | 20 | 31 | 27 |
| | | 28 | 37 | 18 | | | |

| user volume | block1 | | | | | | |
|---|---|---|---|---|---|---|---|
| | | | | | | | |
| | block2 | 0 | 26 | 17 | 6 | 21 | 7 |
| | | 32 | 3 | 14 | 29 | 22 | 8 |
| | block3 | 33 | 11 | 15 | 10 | 9 | 24 |
| | | 34 | 35 | 16 | 5 | 23 | 25 |
| over provisioning | block4 | 36 | 12 | 30 | 20 | 31 | 27 |
| | | 28 | 37 | 18 | | | |

FIG. 1

CONTROL METHOD FOR MEMORY ERASE OPERATIONS, APPARATUS, AND STORAGE MEDIUM THEREOF

CROSS-REFERENCE TO RELATED APPLICATIONS

This application is a continuation of International Application No. PCT/CN2021/129551, filed on Nov. 9, 2021, which claims the benefit of priority to Chinese application No. 202110011459.1, filed on Jan. 6, 2021. The entire contents of which are incorporated herein by reference in their entireties.

BACKGROUND

With the development of $5^{th}$-generation (5G) mobile communication and big data, the demand for memory capacity and memory speed is getting higher and higher. The 3D NAND flash memory is currently the mainstream non-volatile memory. At present, the main erasing method of a 3D NAND flash memory array is to erase in units of memory blocks. As the density of memory cells increases, the erasing speed will gradually slow down, which affects the usage speed of NAND.

When a block1 to be erased is selected, an empty block needs to be selected in advance for data migration before block1 is erased. When there are more and more memory cells in a block, such a block erasing method that requires data migration will seriously affect the erasing speed, and the erasing time will be long. In addition, the method of erasing an entire block will cause the memory cells to be erased frequently, which will affect the data retention of the memory cells, rendering data to be easily lost, and degrading the function of the memory cells.

SUMMARY

The embodiments of the disclosure generally relate to electronic devices, and more specifically, to a control method for a memory, and a memory.

In a first aspect, the embodiments of the disclosure provide a control method for a memory. Each memory block of the memory includes multiple memory strings, and each of the multiple memory strings includes a respective channel layer with an N-type doped region on the top. The control method includes: applying a bit line erasing voltage to a select bit line; applying a top select gate voltage to a top select gate to form a potential difference between the top select gate and the select bit line, wherein the top select gate voltage is lower than the bit line erasing voltage, and the bit line erasing voltage and the top select gate voltage change synchronously; and applying a word line erasing voltage lower than the bit line erasing voltage to corresponding word lines of a memory string connected to the select bit line, so as to implement erasing of the memory string connected to the select bit line.

The embodiments of the disclosure further provide a memory. The memory includes a memory array and a peripheral circuit. Each memory block of the memory array includes multiple memory strings, and each of the multiple memory strings includes a respective channel layer with an N-type doped region on the top. The peripheral circuit is configured to: apply a bit line erasing voltage to a select bit line; apply a top select gate voltage to a top select gate to form a potential difference between the top select gate and the select bit line, wherein the top select gate voltage is lower than the bit line erasing voltage, and the bit line erasing voltage and the top select gate voltage change synchronously; and apply a word line erasing voltage lower than the bit line erasing voltage to corresponding word lines of a memory string connected to the select bit line, so as to implement erasing of the memory string connected to the select bit line.

BRIEF DESCRIPTION OF THE DRAWINGS

One or more embodiments are illustrated in the corresponding drawings, and unless otherwise stated, the drawings do not constitute a scale limitation.

FIG. 1 illustrates a schematic diagram of a data erasing process of a memory in some embodiments.

DETAILED DESCRIPTION

Figure 2:
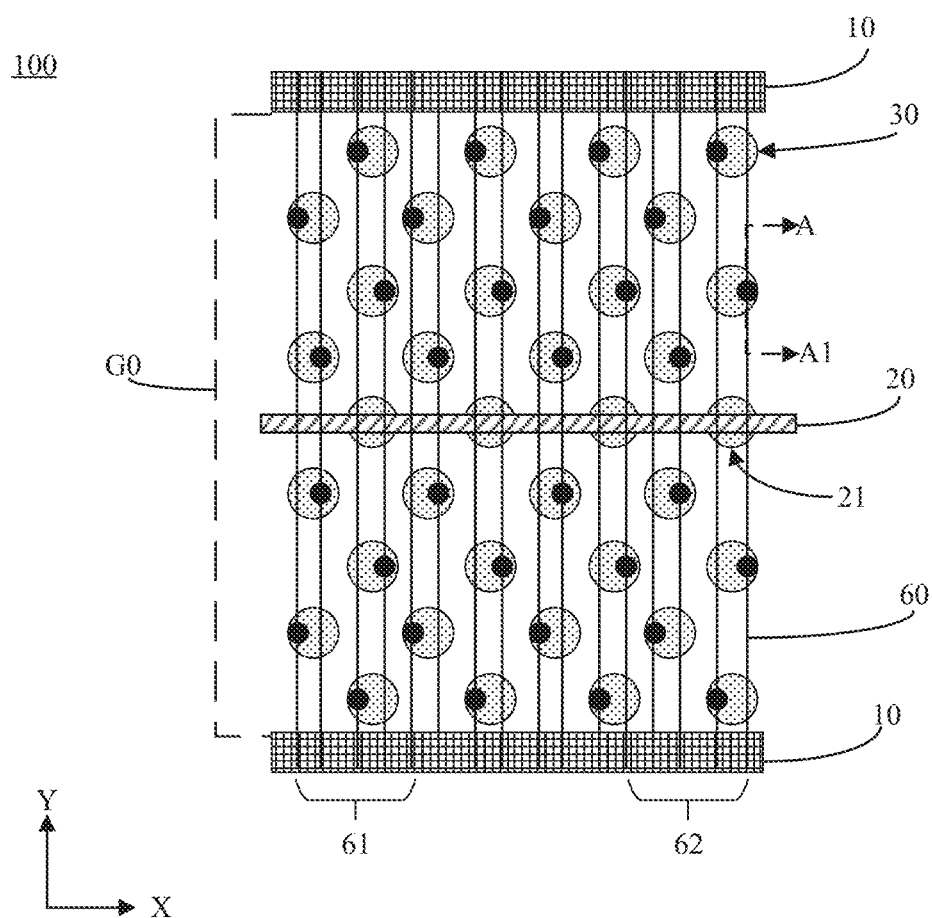
FIG. 2 illustrates a schematic diagram of a cross-section of a memory according to embodiments of the disclosure.

The technical solutions in the embodiments of the disclosure are described below in combination with the drawings. The described embodiments are only some rather than all of the embodiments of the disclosure. Based on the embodiments of the disclosure, all other embodiments obtained by those skilled in the art without creative effort shall fall within the protection scope of the embodiments of the disclosure.

It should be understood that although the terms "first," "second," etc. may be used herein to describe various components, these components should not be limited by these terms. These terms are used to distinguish one component from another. For example, a "first component" may be referred to as a "second component", and similarly, a "second component" may be referred to as a "first component" without departing from the scope of the embodiment of the disclosure.

It should be understood that when a component is referred to as being "on" or "connected" to another component, it may be directly on or connected to the another component, or there may also be intervening components. Other words used to describe the relationship between components should be interpreted in a similar way.

As used herein, the term "layer" refers to a material portion in a region with a thickness. A layer may extend over the entirety of a lower or upper structure, or may have a range smaller than that of the lower or upper structure. In addition, the layer may be a region of a homogeneous or non-homogeneous continuous structure whose thickness is less than that of a continuous structure. For example, the layer may be located between the top and bottom surfaces of the continuous structure or between any horizontal planes at the top and bottom surfaces. The layers may extend horizontally, vertically, and/or along inclined surfaces. The substrate may be a layer, which may include one or more layers, and/or may have one or more layers above and/or below it. The layer may include multiple layers, for example, an interconnection layer may include one or more conductor and contact layers and one or more dielectric layers.

As used herein, the term "memory" refers to a semiconductor device having a vertically oriented array structure on a laterally oriented substrate, such that the array structure extends in a perpendicular direction relative to the substrate. As used herein, the term "longitudinal" refers to the direction perpendicular to the substrate, represented by "Z", in the drawings, "X" refers to the direction parallel to the substrate, and "Y" refers to a direction parallel to the substrate and perpendicular to the "X" direction.

It should be noted that the drawings provided in the embodiments of the disclosure merely illustrate the basic conception of the embodiments of the disclosure in a schematic manner. Although the illustrations only show components related to the embodiments of the disclosure rather than being drawn according to the number, shape, and size of components in the actual implementation, the mode, number, and scale of each component in the actual implementation may be changed at will, and the component layout may be more complex.

FIG. 1 illustrates a schematic diagram of a data erasing process of a memory in some embodiments. The memory is erased in units of memory blocks. When a memory block "block1" that needs to be erased is selected, an additional memory block "over provisioning (OP) block" needs to be set in advance before data migration before block1 is erased. When there are more and more memory cells in a memory block, such a memory block erasing method that requires data migration will seriously affect the erasing speed. For example, when only "1", "2", "13", "4", and "19" in block1 need to be erased, the other data in block1 must be migrated to the OP before these data in block1 are erased.

FIG. 2 illustrates a schematic diagram of a cross section of a memory according to embodiments of the disclosure. The memory 100 includes multiple memory blocks G0 (only one memory block is illustrated in the figure). The multiple memory blocks G0 are separated by gate line slits 10, and a top select gate cut 20 parallel to the gate line slits 10 divides a memory block G0 into two memory regions. A dummy channel structure 21 is provided under the top select gate cut 20. Each memory block G0 includes multiple memory strings 30.

Figure 3:
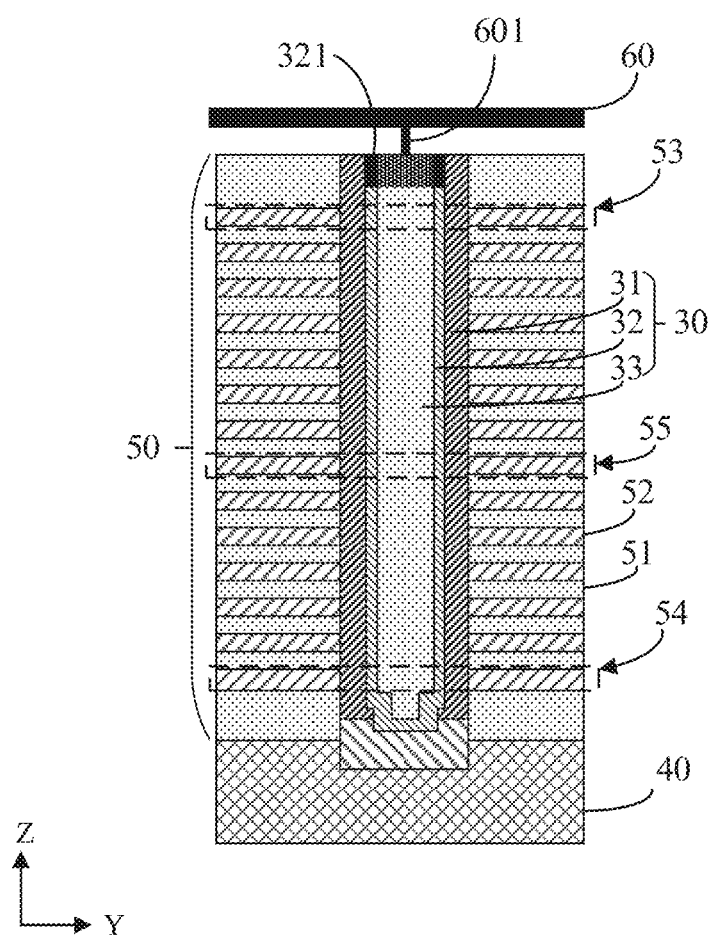
FIG. 3 illustrates a schematic diagram of a cross section of the memory at A-A1 in FIG. 2 according to embodiments of the disclosure.

FIG. 3 illustrates a schematic diagram of a cross section of the memory at A-A1 in FIG. 2 according to embodiments of the disclosure. The memory 100 includes a substrate 40 and stacked layers 50 on the substrate 40. The stacked layers 50 are formed by alternately stacked interlayer insulating layers 51 and interlayer gate layers 52. The interlayer gate layer 52 on the top may serve as a top select gate (TSG) 53, the interlayer gate layer 52 at the bottom may serve as a bottom select gate (BSG) 54, and other interlayer gate layers 52 may serve as word lines (WLs) 55. The memory 100 further includes memory strings 30 (only one memory string 30 is illustrated in the figure) that penetrate the stacked layers 50 in the longitudinal direction (Z). A memory string 30 includes a channel hole penetrating the stacked layers 50, and a storage layer 31, a channel layer 32, and an insulating layer 33 located on the inner sidewall of the channel hole in sequence. The storage layer 31 includes a blocking layer, a charge trapping layer, and a tunneling layer. An N-type doped region 321 is provided at the top of the channel layer 32. In the embodiments of the disclosure, the substrate 40 is a P-type substrate, that is, the substrate may be a P-type doped region (High Voltage P Well, HVPW). The P-type doped region is connected to the channel layer 32 through an epitaxial layer.

In the embodiments of the disclosure, the memory 100 further includes multiple bit lines (BL) 60 extending in a Y direction. Each memory string 30 is connected with a bit line 60 through the channel layer 32 and a bit line contact 601 above the channel layer 32. In the embodiments of the disclosure, one bit line 60 is connected to two of the memory strings 30.

Figure 4:
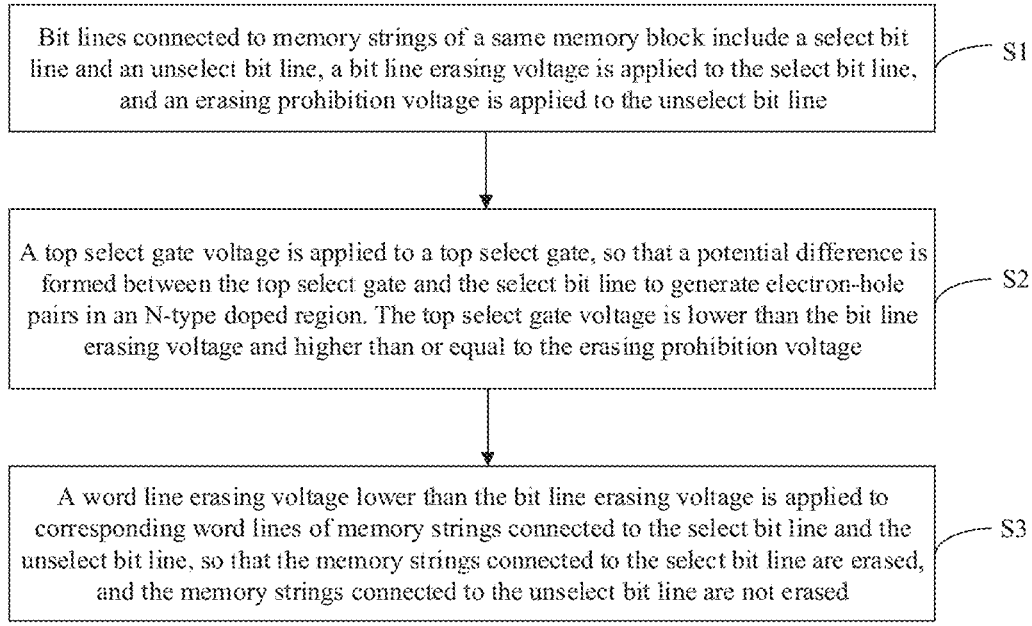
FIG. 4 illustrates a schematic flowchart of a control method for a memory according to embodiments of the disclosure.

FIG. 4 illustrates a schematic flowchart of a control method for a memory according to embodiments of the disclosure. The control method may be applied to the above memory, so structural reference signs of the above memory continue to be used. The schematic flowchart illustrates a method for erasing data from the memory, and the method includes S1-S2.

In S1, bit lines 60 connected to memory strings 30 of a same memory block G0 include a select bit line and an unselect bit line, a bit line erasing voltage is applied to the select bit line, and an erasing prohibition voltage is applied to the unselect bit line.

In S2, a top select gate voltage is applied to a top select gate 53, so that a potential difference is formed between the top select gate 53 and the select bit line to generate electron-hole pairs in the N-type doped region 321. The top select gate voltage is lower than the bit line erasing voltage, and higher than or equal to the erasing prohibition voltage.

In S3, a word line erasing voltage lower than the bit line erasing voltage is applied to corresponding word lines of memory strings connected to the select bit line and the unselect bit line, so that the memory strings 30 connected to the select bit line are erased, and the memory strings 30 connected to the unselect bit line are not erased.

In the embodiments of the disclosure, the "Select Bit Line (Select Bit)" is a bit line connected to a memory string 30 that needs to be erased, and the "Unselect Bit Line (Unselect Bit)" is a bit line connected to a memory string 30 that does not need to be erased.

It may be understood that the erase states of the two memory strings 30 connected to one same bit line 60 are the same. For example, in FIG. 2, some bit lines 61 on the left may be taken as select bit lines, and some bit lines 62 on the right may be taken as unselect bit lines. It should be understood that each bit line 60 exists independently, so each bit line 60 may be a select bit line or an unselect bit line. The "corresponding word lines" refer to word lines 55 connected to the memory string 30 connected to the select bit line and the unselect bit line, that is, the word lines 55 connected to the memory string 30 below the select bit line and the unselect bit line. For example, in FIG. 3, if the bit line 60 illustrated in the figure is a select bit line or an unselect bit line, the word lines 55 connected to the memory string 30 below are corresponding word lines. That is, except for the top select gate 53 and the bottom select gate 54, the other interlayer gate layers 52 are all corresponding word lines.

Figure 5:
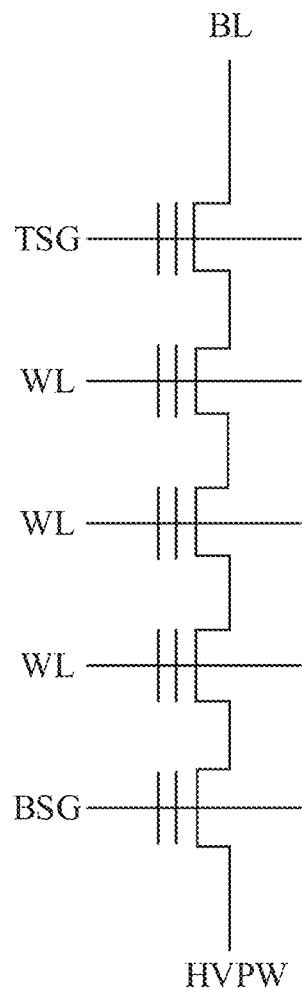
FIG. 5 illustrates a circuit diagram of a memory string in a memory according to embodiments of the disclosure.

FIG. 5 illustrates a circuitry of a memory string in a memory according to embodiments of the disclosure. The circuitry of FIG. 5 corresponds to the structure of the memory string 30 in FIG. 3. The upper end of a memory string is connected to a BL, and the lower end of the memory string is connected to an HVPW. A drain of the TSG is connected to the BL, and a source of a BSG is connected to the HVPW.

Figure 6:
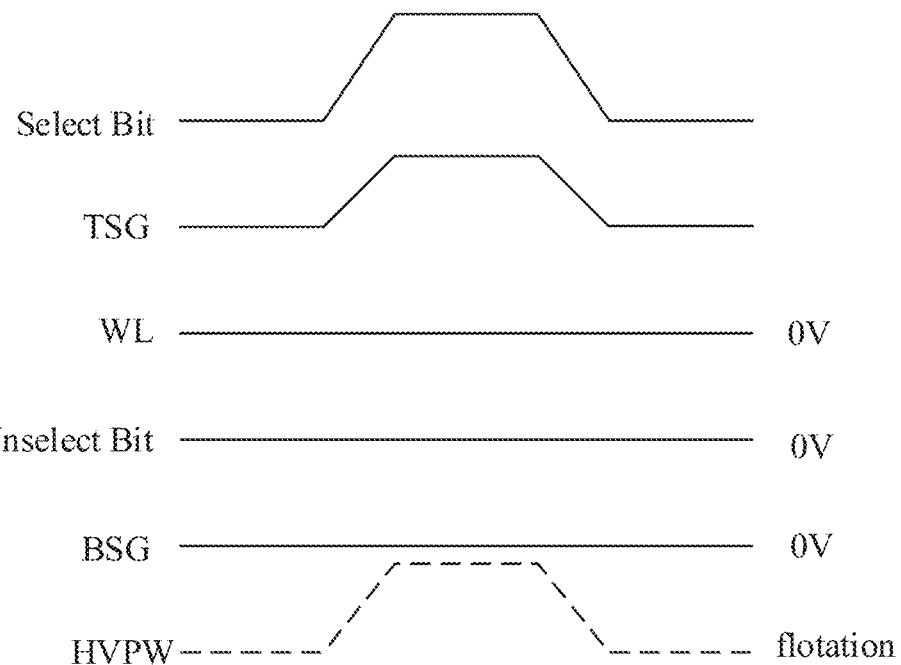
FIG. 6 illustrates a timing diagram of an erasing process of a memory according to embodiments of the disclosure.

FIG. 6 illustrates a timing diagram of an erasing process of a memory according to embodiments of the disclosure. It may be seen from the timing diagram of FIG. 6 that the sequential order of S1-S3 in FIG. 4 is not limited by the flowchart. S1-S3 are all executed according to the time, and may be executed simultaneously, but may be executed by different control units.

In the embodiments of the disclosure, the HVPW is in a floating state, and the voltage at the BSG is 0V. When a bit line erasing voltage (for example, 20V) is applied to the select bit line (Select Bit) and a top select gate voltage (for example, 12V) lower than the bit line erasing voltage is applied to the top select gate (TSG) 53 at the same time. A potential difference is formed between the top select gate (TSG) 53 and the select bit line (Select Bit), and a formed strong electric field generates band2band. Electron-hole pairs are further generated in the N-type doped region 321. Refer to FIG. 3, separate electrons will flow to the select bit line (BL) end, and separate holes will flow to the channel layer 32. The material of the channel layer 32 is a semiconductor (such as polysilicon), so the voltage of the channel layer 32 will gradually increase. When a word line erasing voltage (such as 0V) lower than the bit line erasing voltage is applied to the corresponding word lines, the electrons in the storage layer 31 will flow to the channel layer 32, and then flows to the bit line 60 due to the voltage difference between the channel layer 32 and the corresponding word lines, so that the memory string 30 is erased. When an erasing prohibition voltage (such as 0V) that is less than or equal to the top select gate voltage is applied to the unselect bit line (unselect bit), the unselect bit line will not form a strong electric field with the top select gate (TSG) 53, no electron-hole pair will be generated. There will be no voltage difference generated between the channel layer 32 and the corresponding word lines, so that the memory string 30 is not erased.

When the corresponding word lines are at 0V, the higher the bit line erasing voltage applied to the select bit line (Select Bit) is, the deeper the memory cell is erased. In other words, when the bit line erasing voltage is 20V, the voltage threshold of the storage layer 31 is generally −2V after the erase operation. If it is required to erase deeper, the bit line erasing voltage should be greater than 20V. Therefore, the bit line erasing voltage may be selected according to the depth of erasing.

In the embodiments of the disclosure, the top select gate (TSG) 53 and the bit line erasing voltage increase and decrease synchronously in order to maintain the voltage difference between the select bit line and the top select gate (TSG) 53. When the bit line erasing voltage is 20V, the voltage of the top select gate (TSG) 53 may be 8V-12V. According to the experiments, in order to enable the top select transistor corresponding to the top select gate (TSG) 53 to be in the on state, and to enable that the voltage difference between the top select gate (TSG) 53 and the select bit line may generate electron-hole pairs, 8V-12V is a suitable range of a top select gate voltage.

The control method for a memory according to the embodiments of the disclosure aims to realize data erasing of memory strings on a bit line in the same memory block. A bit line erasing voltage is applied to a select bit line, a top select gate voltage lower than the bit line erasing voltage is applied to a top select gate (TSG) 53, and a word line erasing voltage lower than the bit line erasing voltage is applied to corresponding word lines; thus, erasing of the memory strings 30 corresponding to the select bit line can be realized. At the same time, if an erasing prohibition voltage that is less than or equal to the top select gate voltage is applied to an unselect bit line, the memory strings corresponding to the unselect bit line will not be erased. In this way, it is realized that the bit line is used to select the memory strings to be erased. The need of data migration and the potential data loss that may occur in the erasing process in units of memory blocks are eliminated, the erasing time is effectively reduced, and the erasing rate is greatly improved. At the same time, the number of programming and erasing times of the memory cell may be also reduced, and the degradation of the memory cell is reduced.

Figure 7:
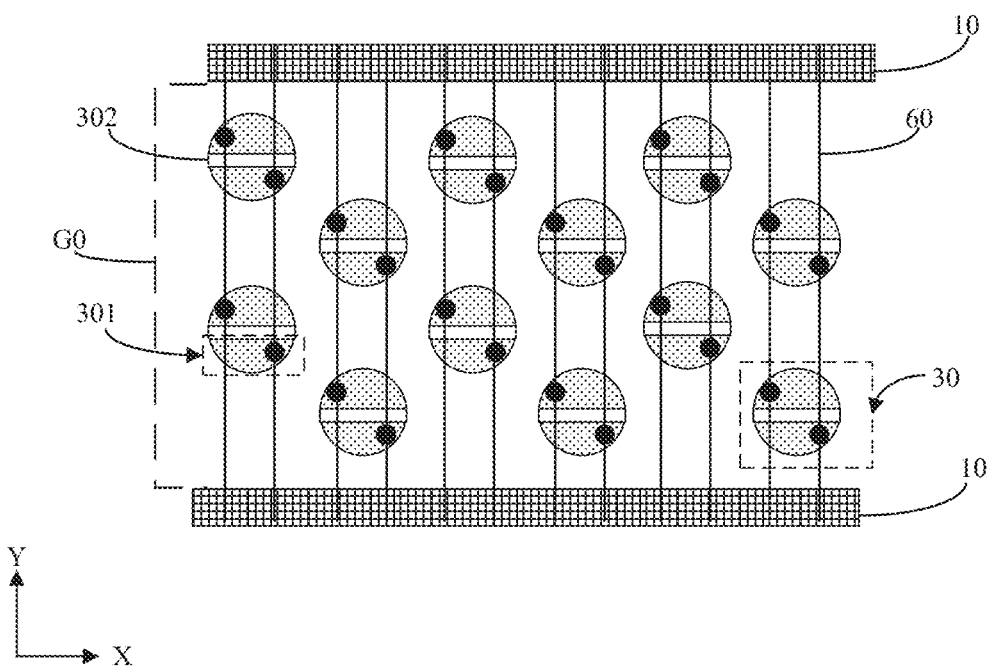
FIG. 7 illustrates a schematic diagram of a cross section of a memory according to embodiments of the disclosure.
Figure 8:
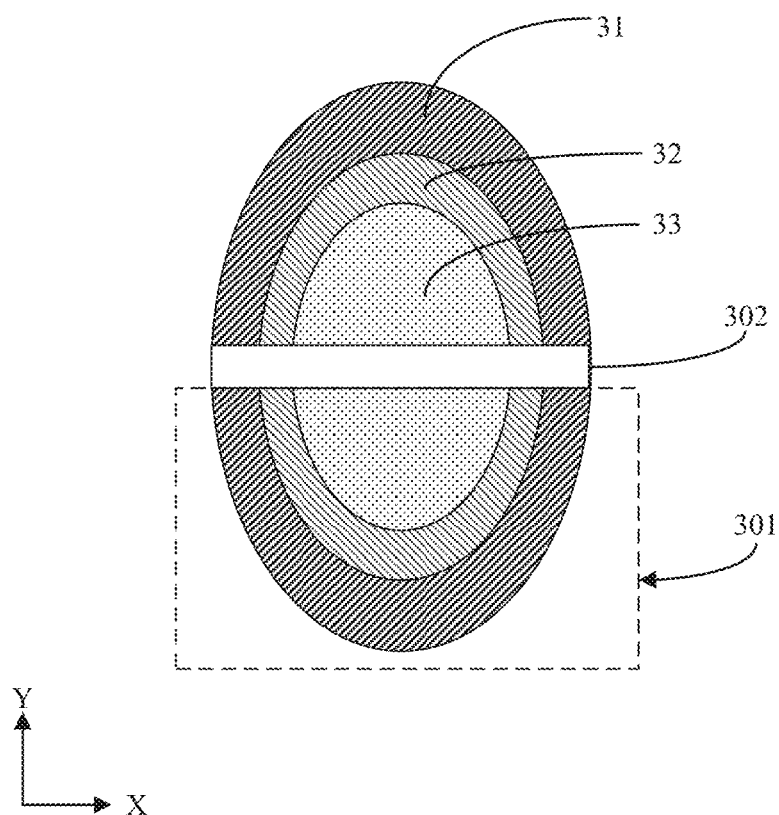
FIG. 8 illustrates a schematic diagram of a cross section of a memory in the XY direction according to embodiments of the disclosure.

Refer to FIGS. 7 and 8. FIG. 7 illustrates a cross section of a top view of a memory according to embodiments of the disclosure. FIG. 8 illustrates a schematic diagram of a cross section of the memory in the XY direction according to embodiments of the disclosure. For the convenience of understanding, in this embodiment, the same reference numerals are used for the same structures as in the above embodiment. The memory 200 includes memory blocks G0 separated by gate line slits 10. In a memory block G0, a memory string 30 includes two memory sub-strings 301, and the two memory sub-strings 301 are separated by a separating slot 302. The memory string 30 includes a storage layer 31, a channel layer 32, and an insulating layer 33. The storage layer 31, the channel layer 32, and the insulating layer 33 are all separated into two parts by the separating slot 302. For example, the channel layer 32 is separated into two channel sub-layers. Each of the memory sub-strings 301 is connected to a respective bit line 60 through a respective one of the channel sub-layers, and the respective bit line 60 is connected to two memory sub-strings 301.

The control method for a memory according to the embodiments of the disclosure may also be applied to the memory 200. The difference is that a select bit line corresponds to a memory sub-string 301 rather than a memory string 30. Therefore, it is possible to perform an erasing operation on the memory sub-strings corresponding to the select bit line, and perform no erasing operation on the memory sub-strings corresponding to the unselect bit line.

Figure 9:
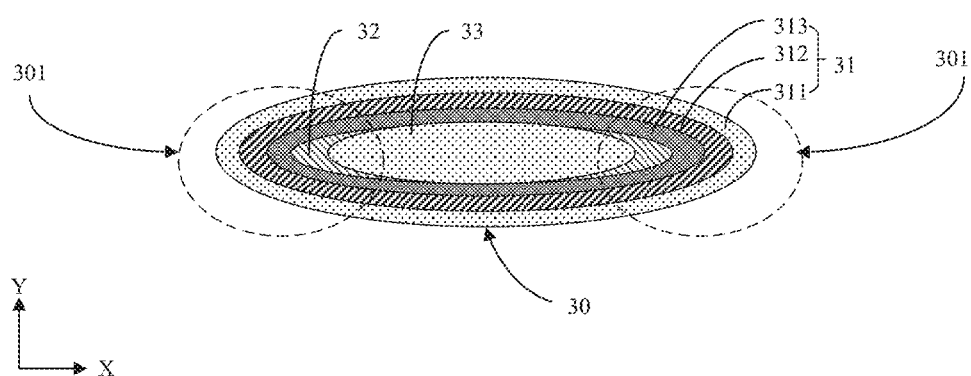
FIG. 9 illustrates a schematic diagram of a cross section of a memory in the XY direction according to a variant of embodiments of the disclosure.

FIG. 9 illustrates a schematic diagram of a cross section of a memory in the XY direction according to a variant of embodiments of the disclosure. The memory 300 includes memory strings 30. A memory string 30 includes a storage layer 31, a channel layer 32, and an insulating layer 33. The storage layer 31 includes a blocking layer 311, a charge trapping layer 312, and a tunneling layer 313. A memory string 30 includes two memory sub-strings 301, and the channel layer 32 is divided into two channel sub-layers by an insulating layer 33. In a variant, each memory sub-string 301 is connected to a respective bit line through a respective channel sub-layer as in the above embodiment, and the respective bit line is connected to two memory sub-strings 301. The control method for the memory 300 is the same as the above embodiments of the disclosure.

Figure 10:
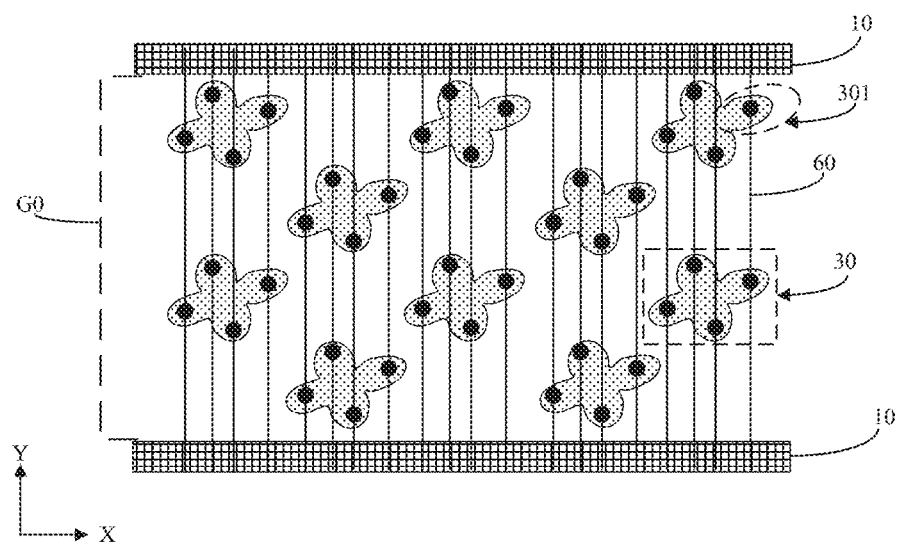
FIG. 10 illustrates a schematic diagram of a top view of a memory according to embodiments of the disclosure.
Figure 11:
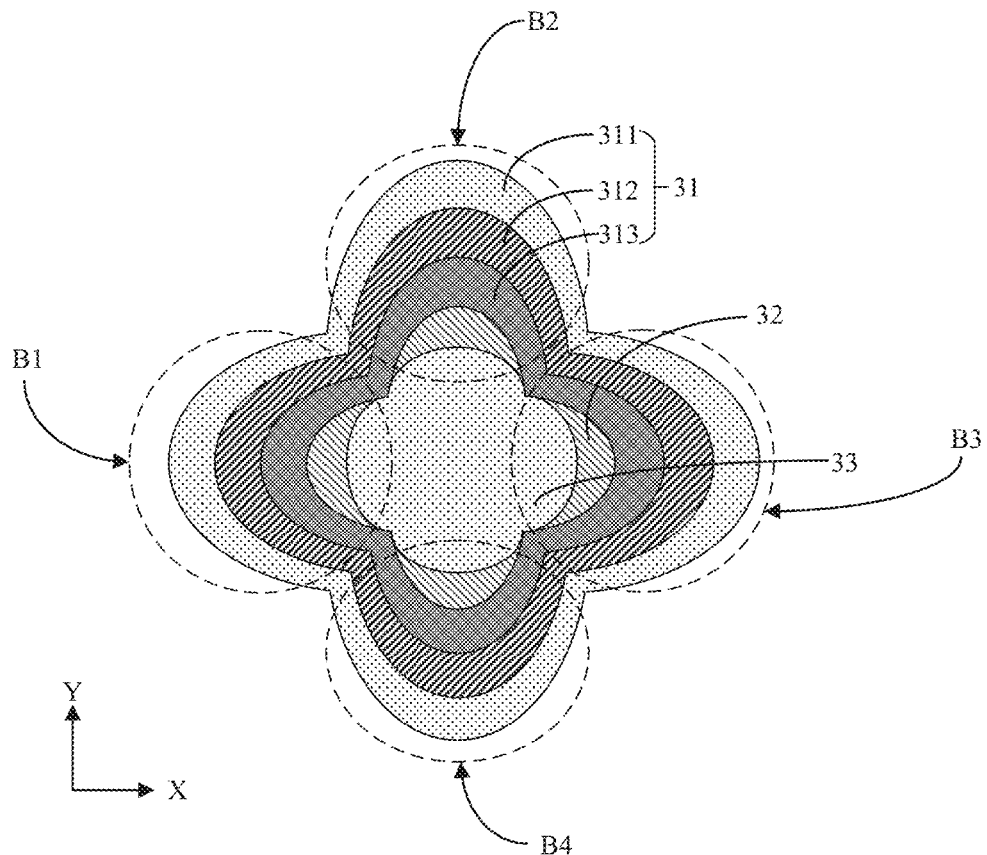
FIG. 11 illustrates a schematic diagram of a cross section of a memory in the XY direction according to embodiments of the disclosure.

Refer to FIG. 10 and FIG. 11, FIG. 10 illustrates a schematic diagram of a top view of a memory according to embodiments of the disclosure. FIG. 11 illustrates a schematic diagram of a cross section of the memory in the XY direction according to embodiment of the disclosure. The memory string 30 includes four memory sub-strings 301, and the channel layer 32 is divided into four channel sub-layers by an insulating layer 33. The memory string 30 has multiple convex portions (B1, B2, B3, and B4) in a plane (XY) direction parallel to the substrate. The multiple convex portions extend along the longitudinal direction (Z). Each of the channel sub-layers is located in a respective one of the convex portions to form a respective one of the memory sub-strings 301. In fact, in the above embodiment (FIG. 8) and related variant (FIG. 9), the memory string 30 may also have two convex portions in the plane (XY) direction parallel to the substrate.

The control method for a memory according to the embodiments of the disclosure may also be applied to the memory 400, and the operation process is the same as the above embodiment, except that the select bit line is connected to the memory sub-string 301. The beneficial effects of the control method will not be repeated here.

Figure 12:
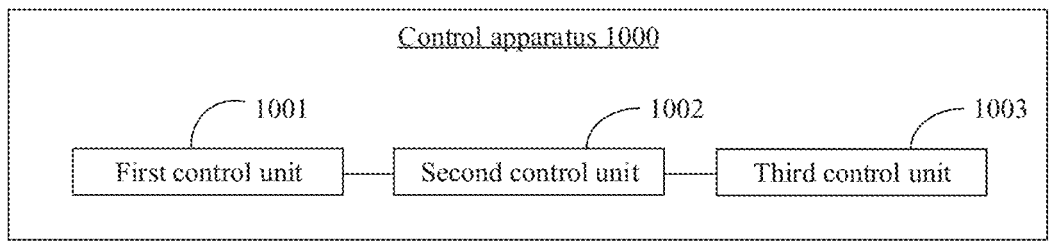
FIG. 12 illustrates a schematic structural diagram of a control apparatus for a memory according to embodiments of the disclosure.

In order to implement the method in the embodiments of the disclosure, the embodiments of the disclosure further provide a control apparatus for a memory. FIG. 12 illustrates a schematic diagram of a control apparatus for a memory according to embodiments of the disclosure. The control apparatus 100 for the memory includes a first control unit 1001, a second control unit 1002, and a third control unit 1003.

The first control unit 1001 is configured to apply a bit line erasing voltage to a select bit line, and to apply an erasing prohibition voltage to an unselect bit line.

The second control unit 1002 is configured to apply a top select gate voltage to a top select gate, to form a potential difference between the top select gate and the select bit line to generate electron-hole pairs in the N-type doped region. The top select gate voltage is lower than the bit line erasing voltage and higher than or equal to the erasing prohibition voltage.

The third control unit 1003 is configured to apply a word line erasing voltage lower than the bit line erasing voltage to corresponding word lines of a memory string connected to the select bit line and the unselect bit line, so as to erase a memory string connected to the select bit line, and to not erase a memory string connected to the unselect bit line.

It should be noted that when the control apparatus 1000 for the memory according to the above embodiment performs control operations, the division of the above program modules is only taken as an example for illustration. In actual applications, the above processing may be allocated to different program modules as needed, that is, the internal structure of the apparatus is divided into different program modules to complete all or part of the processing described above. In addition, the control apparatus for a memory and the control method for a memory according to above embodiments belong to the same concept, and the specific implementation process is detailed in the method embodiment, and will not be repeated here.

Figure 13:
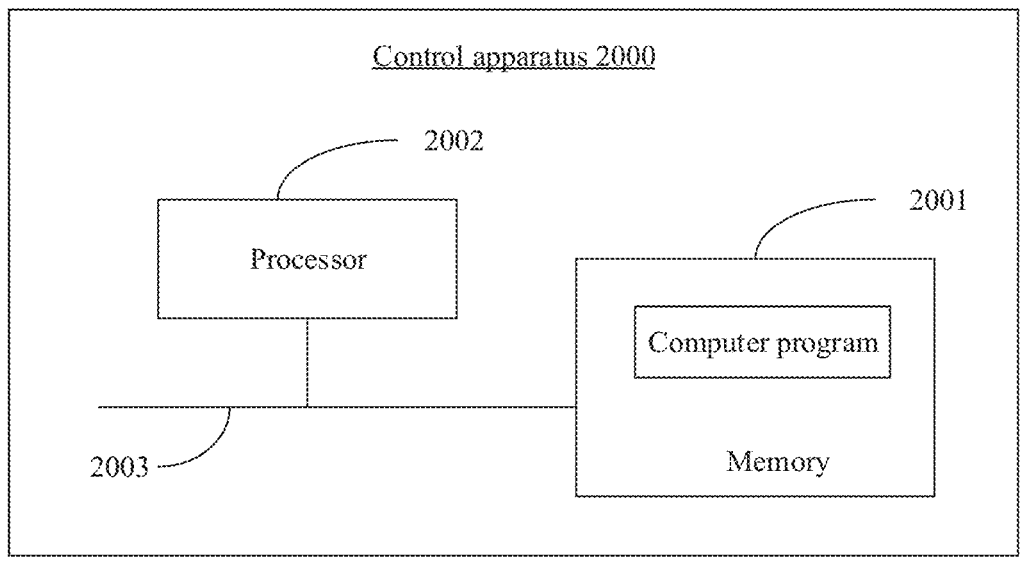
FIG. 13 illustrates a schematic structural diagram of a control apparatus for a memory according to embodiments of the disclosure.

Based on the hardware implementation of the above program modules, and in order to implement the method in the embodiments of the disclosure, the embodiments of the disclosure further provides a control apparatus for a memory. FIG. 13 illustrates a schematic diagram of a control apparatus for a memory according to embodiments of the disclosure. The control apparatus 2000 for the memory includes a memory 2001 and a processor 2002.

The memory 2001 is configured to store executable instructions.

The processor 2002 is configured to implement the control method for a memory according to the embodiments of the disclosure when executing the executable instructions stored in the memory.

In an actual application, as illustrated in FIG. 13, the various components in the control apparatus 1200 for the memory are coupled together through a bus system 2003. It may be understood that the bus system 2003 is configured to implement connection and communication between these components. In addition to the data bus, the bus system 2003 also includes a power bus, a control bus, and a status signal bus. However, for the sake of clarity, the various buses are marked as the bus system 2003 in FIG. 13.

In a first aspect, the embodiments of the disclosure provide a control method for a memory. Each memory block of the memory includes multiple memory strings, and each of the multiple memory strings includes a respective channel layer with an N-type doped region on the top. The control method includes: applying a bit line erasing voltage to a select bit line; applying a top select gate voltage to a top select gate to form a potential difference between the top select gate and the select bit line, wherein the top select gate voltage is lower than the bit line erasing voltage, and the bit line erasing voltage and the top select gate voltage change synchronously; and applying a word line erasing voltage lower than the bit line erasing voltage to corresponding word lines of a memory string connected to the select bit line, so as to implement erasing of the memory string connected to the select bit line.

In some embodiments, bit lines connected to memory strings of a same memory block include a select bit line and an unselect bit line, and the control method further includes: applying an erasing prohibition voltage to the unselect bit line, to not erase a memory string connected to the unselect bit line, wherein the top select gate voltage is higher than or equal to the erasing prohibition voltage.

In some embodiments, the memory further includes a P-type doped region at the bottom of the multiple memory strings, the P-type doped region is connected to the channel layer of each of the multiple memory strings through an epitaxial layer, and the method further includes: floating the P-type doped region.

In some embodiments, each of the multiple memory strings is connected to a respective bit line through the respective channel layer, and the respective bit line is connected to two of the multiple memory strings.

In some embodiments, each of the multiple memory strings includes multiple memory sub-strings, the channel layer of each of the multiple memory strings is divided into multiple channel sub-layers, each of the multiple memory sub-strings is connected to a respective bit line through a respective one of the multiple channel sub-layers, and the respective bit line is connected to two of the multiple memory sub-strings.

In some embodiments, each of the multiple memory strings has multiple convex portions in a direction parallel to a surface of a substrate, the multiple convex portions extend in a longitudinal direction, and a channel sub-layer is provided in each of the multiple convex portions to form a respective one of the multiple memory sub-string.

In some embodiments, the applying a word line erasing voltage lower than the bit line erasing voltage to corresponding word lines of a memory string connected to the select bit line, so as to implement erasing of the memory string connected to the select bit line includes: applying the word line erasing voltage lower than the bit line erasing voltage to corresponding word lines of a memory sub-string connected to the select bit line, so as to implement erasing of the memory sub-string connected to the select bit line The embodiments of the disclosure further provide a control method for a memory. Each memory block of the memory includes multiple memory strings, each of the multiple memory strings includes a respective channel layer with an N-type doped region on the top, and a P-type doped region at the bottom of the multiple memory strings is connected to the channel layer of each of the multiple memory strings through an epitaxial layer. The control method includes: applying a bit line erasing voltage to a select bit line; applying a top select gate voltage to a top select gate to form a potential difference between the top select gate and the select bit line, wherein the top select gate voltage is lower than the bit line erasing voltage; applying a word line erasing voltage lower than the bit line erasing voltage to corresponding word lines of a memory string connected to the select bit line, so as to implement erasing of the memory string connected to the select bit line; and floating the P-type doped region.

In some embodiments, bit lines connected to memory strings of a same memory block include a select bit line and an unselect bit line, and the control method further includes: applying an erasing prohibition voltage to the unselect bit line, to not erase a memory string connected to the unselect bit line, wherein the top select gate voltage is higher than or equal to the erasing prohibition voltage.

In some embodiments, each of the multiple memory strings is connected to a respective bit line through the respective channel layer, and the respective bit line is connected to two of the multiple memory strings.

In some embodiments, each of the multiple memory strings includes multiple memory sub-strings, the channel layer of each of the multiple memory strings is divided into multiple channel sub-layers, each of the multiple memory sub-strings is connected to a respective bit line through a respective one of the multiple channel sub-layers, and the respective bit line is connected to two of the multiple memory sub-strings.

In some embodiments, each of the multiple memory strings has multiple convex portions in a direction parallel to a surface of a substrate, the multiple convex portions extend in a longitudinal direction, and a channel sub-layer is provided in each of the multiple convex portions to form a respective one of the multiple memory sub-strings.

In some embodiments, the applying a word line erasing voltage lower than the bit line erasing voltage to corresponding word lines of a memory string connected to the select bit line, so as to implement erasing of the memory string connected to the select bit line includes: applying the word line erasing voltage lower than the bit line erasing voltage to corresponding word lines of a memory sub-string connected to the select bit line, so as to implement erasing of the memory sub-string connected to the select bit line.

In some embodiments, the bit line erasing voltage and the top select gate voltage increase synchronously, and decrease synchronously.

The embodiments of the disclosure further provide a memory. The memory includes a memory array and a peripheral circuit. Each memory block of the memory array includes multiple memory strings, and each of the multiple memory strings includes a respective channel layer with an N-type doped region on the top. The peripheral circuit is configured to: apply a bit line erasing voltage to a select bit line; apply a top select gate voltage to a top select gate to form a potential difference between the top select gate and the select bit line, wherein the top select gate voltage is lower than the bit line erasing voltage, and the bit line erasing voltage and the top select gate voltage change synchronously; and apply a word line erasing voltage lower than the bit line erasing voltage to corresponding word lines of a memory string connected to the select bit line, so as to implement erasing of the memory string connected to the select bit line.

In some embodiments, bit lines connected to memory strings of a same memory block include a select bit line and an unselect bit line, and the peripheral circuit is further configured to: apply an erasing prohibition voltage to the unselect bit line, to not erase a memory string connected to the unselect bit line, wherein the top select gate voltage is higher than or equal to the erasing prohibition voltage The embodiments of the disclosure further provide a memory. The memory includes a memory array and a peripheral circuit. Each memory block of the memory array includes multiple memory strings, each of the multiple memory strings includes a respective channel layer with an N-type doped region on the top, and a P-type doped region at the bottom of the multiple memory strings is connected to the channel layer of each of the multiple memory strings through an epitaxial layer. The peripheral circuit is configured to: apply a bit line erasing voltage to a select bit line; apply a top select gate voltage to a top select gate to form a potential difference between the top select gate and the select bit line, wherein the top select gate voltage is lower than the bit line erasing voltage; apply a word line erasing voltage lower than the bit line erasing voltage to corresponding word lines of a memory string connected to the select bit line, so as to implement erasing of the memory string connected to the select bit line; and float the P-type doped region.

In some embodiments, bit lines connected to memory strings of a same memory block include a select bit line and an unselect bit line, and the peripheral circuit is further configured to: apply an erasing prohibition voltage to the unselect bit line, to not erase a memory string connected to the unselect bit line, wherein the top select gate voltage is higher than or equal to the erasing prohibition voltage.

The embodiments of the disclosure further provide a storage medium having stored thereon executable instructions that, when executed by at least one processor, cause the at least one processor to implement the control method for a memory according to the embodiments of the disclosure.

In some embodiments, the storage medium may be a memory, such as a ferromagnetic random access memory (FRAM), a read-only memory (ROM), a programmable read-only memory (PROM), an erasable programmable read-only memory (EPROM), an electrically erasable programmable read-only memory (EEPROM), a flash memory (Flash Memory), a magnetic surface memory, an optical disk, or a compact disc read-only memory (CD-ROM). The storage medium may also be a variety of devices including one or any combination of the above memories.

In some embodiments, the executable instructions may be in the form of programs, software, software modules, scripts, or codes, written in any form of programming language (including compiling or interpreting languages, or declarative or procedural languages), and may be deployed in any form, including being deployed as an independent program or as a module, a component, a subroutine, or other units suitable for use in a computing environment.

As an example, executable instructions may but do not necessarily correspond to files in the file system, and may be stored as a part of a file that stores other programs or data, for example, stored in one or more scripts in a hypertext markup language (HTML) document, stored in a single file dedicated to the program in question, or stored in multiple collaborative files (for example, a file that stores one or more modules, subroutines, or code parts).

As an example, executable instructions may be deployed to be executed on one computing device, on multiple computing devices located in one location, or on multiple computing devices that are distributed in multiple locations and interconnected by a communication network.

The description of the above embodiments is only used to help understand the technical solutions and core ideas of the disclosure. Those of ordinary skill in the art should understand that they may still modify the technical solutions described in the above embodiments, or make equivalent replacements to some technical features. However, these modifications or replacements do not cause the essence of the corresponding technical solutions to deviate from the scope of the technical solutions in the embodiments of the disclosure.

The invention claimed is:

1. A control method for a memory, wherein the memory comprises memory blocks each comprising memory strings, each of the memory strings comprises a channel layer with an N-type doped top region, and the control method comprises:
applying a bit line erasing voltage to a select bit line;
applying a top select gate voltage to a top select gate, wherein the top select gate voltage is lower than the bit line erasing voltage to form a potential difference, in the N-type doped top region, above the top select gate, and the bit line erasing voltage and the top select gate voltage change synchronously; and
applying a word line erasing voltage lower than the bit line erasing voltage to corresponding word lines of a memory string connected to the select bit line, to implement erasing of the memory string connected to the select bit line.

2. The control method for the memory according to claim 1, wherein bit lines connected to memory strings of a same memory block comprise a select bit line and an unselect bit line, and the control method further comprises:
applying an erasing prohibition voltage to the unselect bit line, to not erase a memory string connected to the unselect bit line, wherein the top select gate voltage is higher than or equal to the erasing prohibition voltage.

3. The control method for the memory according to claim 1, wherein the memory further comprises a P-type doped region at a bottom of the memory strings, the P-type doped region is connected to the channel layer of each of the memory strings through an epitaxial layer, and the method further comprises:
floating the P-type doped region.

4. The control method for the memory according to claim 1, wherein each of the memory strings is connected to a respective bit line through the respective channel layer, and the respective bit line is connected to two of the memory strings.

5. The control method for the memory according to claim 1, wherein each of the memory strings comprises memory sub-strings, the channel layer of each of the memory strings is divided into channel sub-layers, each of the memory sub-strings is connected to a respective bit line through a respective one of the channel sub-layers, and the respective bit line is connected to two of the memory sub-strings.

6. The control method for the memory according to claim 5, wherein each of the memory strings comprises convex portions in a direction parallel to a surface of a substrate, each of the convex portions extends in a longitudinal direction and has a channel sub-layer to form a respective one of the memory sub-string.

7. The control method for the memory according to claim 5, wherein applying the word line erasing voltage lower than the bit line erasing voltage to corresponding word lines of the memory string connected to the select bit line comprises:
applying the word line erasing voltage lower than the bit line erasing voltage to corresponding word lines of a memory sub-string connected to the select bit line, to implement erasing of the memory sub-string connected to the select bit line.

8. A memory, comprising:
a memory array comprising memory blocks, wherein each memory block comprises memory strings, each of the memory strings comprises a channel layer with an N-type doped top region; and
a peripheral circuit, configured to:
apply a bit line erasing voltage to a select bit line;
apply a top select gate voltage to a top select gate, wherein the top select gate voltage is lower than the bit line erasing voltage to form a potential difference, in the N-type doped top region, above the top select gate, and the bit line erasing voltage and the top select gate voltage change synchronously; and
apply a word line erasing voltage lower than the bit line erasing voltage to corresponding word lines of a memory string connected to the select bit line, to implement erasing of the memory string connected to the select bit line.

9. The memory according to claim 8, wherein bit lines connected to memory strings of a same memory block comprise a select bit line and an unselect bit line, and the peripheral circuit is further configured to:
apply an erasing prohibition voltage to the unselect bit line, to not erase a memory string connected to the unselect bit line, wherein the top select gate voltage is higher than or equal to the erasing prohibition voltage.

10. The memory according to claim 8, wherein the memory further comprises a P-type doped region at a bottom of the memory strings, the P-type doped region is connected to the channel layer of each of the memory strings through an epitaxial layer, and the peripheral circuit is further configured to:
float the P-type doped region.

11. The memory according to claim 8, wherein each of the memory strings is connected to a respective bit line through the respective channel layer, and the respective bit line is connected to two of the memory strings.

12. The memory according to claim 8, wherein each of the memory strings comprises memory sub-strings, the channel layer of each of the memory strings is divided into channel sub-layers, each of the memory sub-strings is connected to a respective bit line through a respective one of the channel sub-layers, and the respective bit line is connected to two of the memory sub-strings.

13. The memory according to claim 11, wherein each of the memory strings comprises convex portions in a direction parallel to a surface of a substrate, each of the convex portions extends in a longitudinal direction and has a channel sub-layer to form a respective one of the memory sub-string.

14. A memory, comprising:
a memory array comprising memory blocks, wherein each memory block comprises memory strings, each of the memory strings comprises a channel layer with an N-type doped top region;
a P-type doped region at a bottom of the memory strings, wherein the P-type doped region is connected to the channel layer of each of the memory strings through an epitaxial layer; and
a peripheral circuit, configured to:
  apply a bit line erasing voltage to a select bit line;
  apply a top select gate voltage to a top select gate, wherein the top select gate voltage is lower than the bit line erasing voltage to form a potential difference, in the N-type doped top region, above the top select gate;
  apply a word line erasing voltage lower than the bit line erasing voltage to corresponding word lines of a memory string connected to the select bit line, to implement erasing of the memory string connected to the select bit line; and
  float the P-type doped region.

15. The memory according to claim 14, wherein bit lines connected to memory strings of a same memory block comprise a select bit line and an unselect bit line, and the peripheral circuit is further configured to:
  apply an erasing prohibition voltage to the unselect bit line, to not erase a memory string connected to the unselect bit line, wherein the top select gate voltage is higher than or equal to the erasing prohibition voltage.

16. The memory according to claim 14, wherein each of the memory strings is connected to a respective bit line through the respective channel layer, and the respective bit line is connected to two of the memory strings.

17. The memory according to claim 16, wherein each of the memory strings comprises memory sub-strings, the channel layer of each of the memory strings is divided into channel sub-layers, each of the memory sub-strings is connected to a respective bit line through a respective one of the channel sub-layers, and the respective bit line is connected to two of the memory sub-strings.

18. The memory according to claim 17, wherein each of the memory strings comprises convex portions in a direction parallel to a surface of a substrate, each of the convex portions extends in a longitudinal direction and has a channel sub-layer to form a respective one of the memory sub-strings.

19. The memory according to claim 17, wherein the peripheral circuit is further configured to:
  apply the word line erasing voltage lower than the bit line erasing voltage to corresponding word lines of a memory sub-string connected to the select bit line, to implement erasing of the memory sub-string connected to the select bit line.

20. The memory according to claim 14, wherein the bit line erasing voltage and the top select gate voltage increase synchronously, and decrease synchronously.

* * * * *